United States Patent [19]

Schell

[11] 4,220,389

[45] Sep. 2, 1980

[54] CIRCUIT CARD CONNECTOR

[75] Inventor: Mark S. Schell, New Cumberland, Pa.

[73] Assignee: E. I. Du Pont de Nemours and Company, Wilmington, Del.

[21] Appl. No.: 65,865

[22] Filed: Aug. 13, 1979

[51] Int. Cl.[3] .................... H05K 1/07

[52] U.S. Cl. .................... 339/74 R; 339/75 MP

[58] Field of Search .................... 339/17 L, 74 R, 75 MP

[56] References Cited

U.S. PATENT DOCUMENTS

| | | | |
|---|---|---|---|
| 3,366,916 | 1/1968 | Oktay | 339/74 R |
| 3,569,905 | 3/1971 | Kehagioglou | 339/75 MP |

*Primary Examiner*—Neil Abrams

[57] ABSTRACT

A zero insertion force circuit card connector having a fixed base and a movable housing. At least one flexible inside terminal and one outside terminal are fixedly supported by the base in opposed spaced relation to each other. A spring biases the inside terminal from an open position toward the outside terminal to a closed position embracing the edge of a circuit card. An expandable tube located between the housing and the base can be expanded to move the housing against the bias of the spring thereby relieving the tension on the inside terminal.

8 Claims, 4 Drawing Figures

CIRCUIT CARD CONNECTOR

BACKGROUND OF THE INVENTION

This invention relates to a circuit card connector, and more particularly, to an improved zero insertion force circuit card connector.

U.S. Pat. No. 3,366,916 to Oktay discloses a circuit card connector of the type wherein opposed pairs of spring loaded contacts are simultaneously forced apart by the expansion of an expandable tube inserted therebetween. The tube can be removably inserted between one or more pairs of opposed contacts, and when expanded, it biases the contacts apart for removal or insertion of a circuit card.

It is noted that the location of such an expandable tube between the pairs of opposed contacts can create a relatively high profile, i.e., there is a relatively long distance between the active elements on a circuit card and the contact terminal of the connector, and signal fidelity can be reduced because of the distance a signal must travel in the unprotected environment of the connector. It is imperative, therefore, that the total signal path length between a backplane and a daughter card be as short as possible. The present invention combines a first and second biasing elements within the geometry of a movable housing with a generally rigid base to obtain a zero insertion force connector having a relatively low profile.

SUMMARY OF THE INVENTION

According to the present invention, there is provided an improved zero insertion force circuit card connector comprising a generally rigid dielectric base having an upstanding longitudinal rib, at least one pair of opposed terminals and a movable dielectric housing. The housing, which comprises a first panel integrally joined to a second panel by a web, is arranged to move tranversely with respect to the longitudinal axis of the base. The opposed terminals comprise a generally rigid outside terminal and a shaped and relieved inside terminal flexibly disposed at a slight angle from the outside terminal. The first panel is generally parallel to the rib and located between the rib and inside terminal. The second panel is also generally parallel to the rib, creating a longitudinal passage therebetween. A spring is located between the rib and first panel to bias the inside terminal toward the outside terminal to embrace the edge of a circuit card inserted therebetween. An expandable tube is located in the longitudinal passage to move the housing transversely relative to the longitudinal axis of the base against the bias of the spring thereby relieving the tension on the inside terminal.

The movable housing further comprises a support leg integrally joined to the first panel and having a generally horizontal receiving surface which extends between the inside and outside terminals for receiving and supporting the edge of a circuit card. The housing further comprises a plurality of upwardly projecting leaves integrally joined to the support leg and arranged in parallel spaced relation to the outside terminal.

The present invention optionally includes a card guide for guiding a circuit card into the connector and a rear stop against which an inserted card will come to rest having its conducting elements aligned with the opposed inside and outside terminals.

DETAILED DESCRIPTION OF THE ILLUSTRATED CONNECTOR

Figure 1:
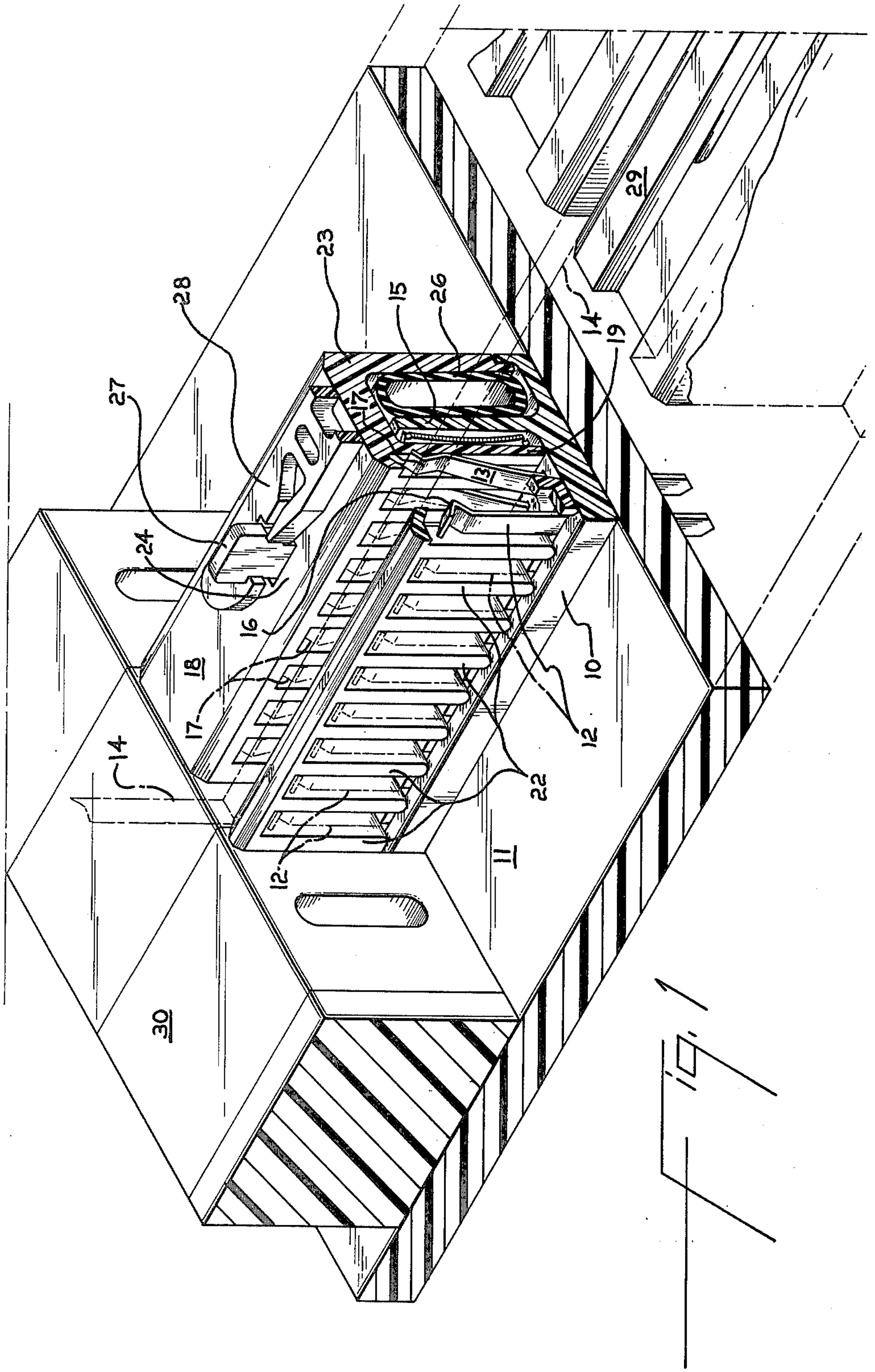
FIG. 1 is an exploded perspective view, the parts having been broken away and shown in section to reveal details of the connector of this invention.

Referring now to the drawings, there is shown a typical circuit card connector of this invention. Base 10 can be generally rectangular having a flat surface attachable to a backplane 11 either individually, in pairs or in any suitable array. Rigid outside terminals 12 are fixedly supported by base 10 and ordinarily extend through backplane 11.

Inside terminals 13 are fixedly supported by base 10, ordinarily extending through backplane 11, and are located in opposed spaced relation to outside terminals 12 to form an opening between which the edge of a circuit card 14 can be inserted. Inside terminals 13 are shaped and relieved to define leaf springs which are flexibly disposed at a slight angle from outside terminals 12. Thus, a force must be applied to inside terminals substantially normal to a surface of a circuit card to overcome their natural resilient bias and urge them toward the outside terminals 12 to embrace the edge of a circuit card.

Base 10 is generally rectangular in shape having an upstanding longitudinal rib 15. It can be formed of any rigid dielectric material such as a molded plastic resin or the like. Terminals 12 and 13 are usually of the leaf type and can be formed of any suitable conducting materials such as a copper alloy or a phosphor/bronze. The contact surfaces 16 and 17 of the terminals are usually overlayed with a thin coating of gold for improved contact resistance.

Figure 3:
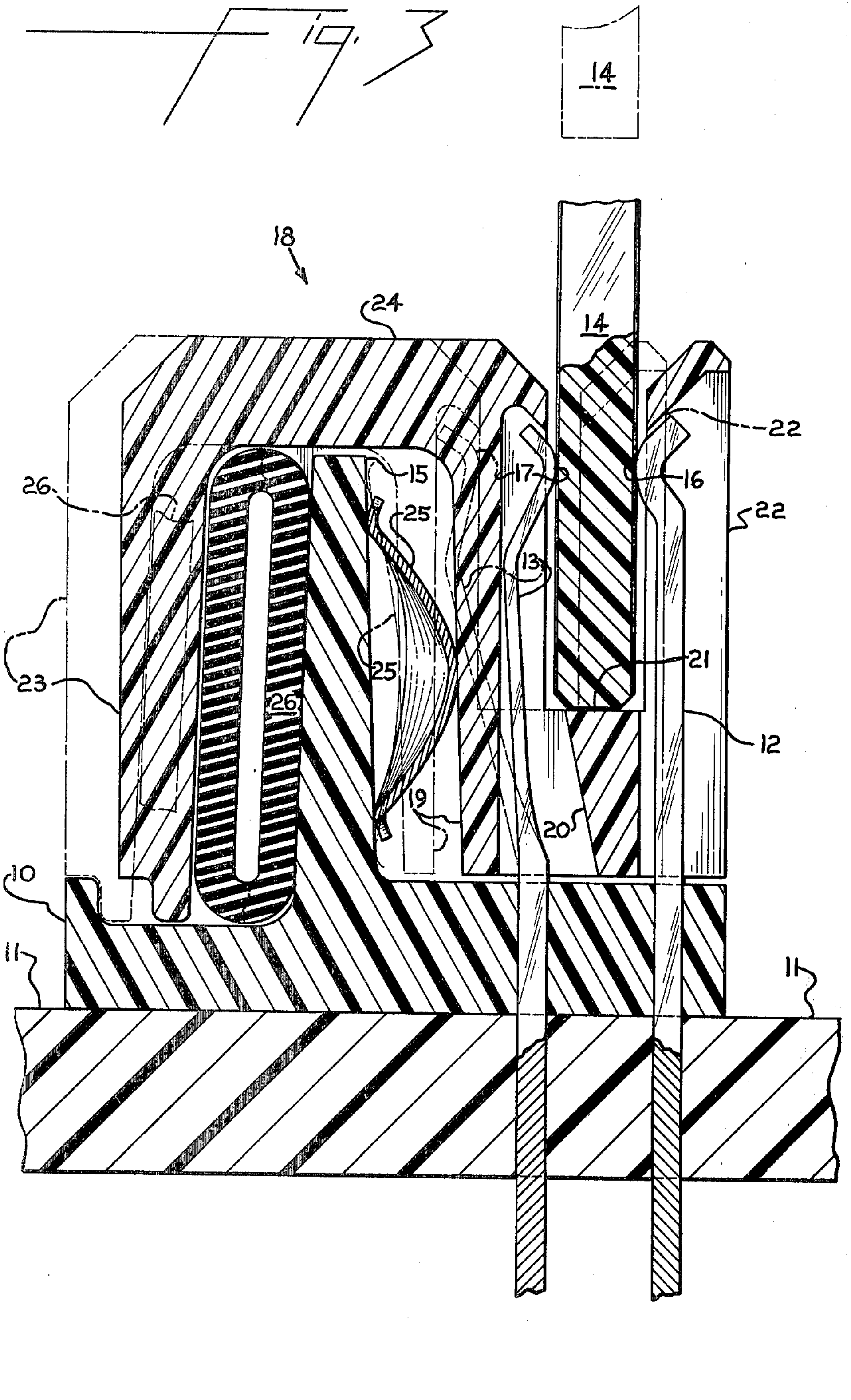
FIG. 3 is a cross-sectional view of the connector in which the terminals are in a closed position embracing the edge of a circuit card.
Figure 4:
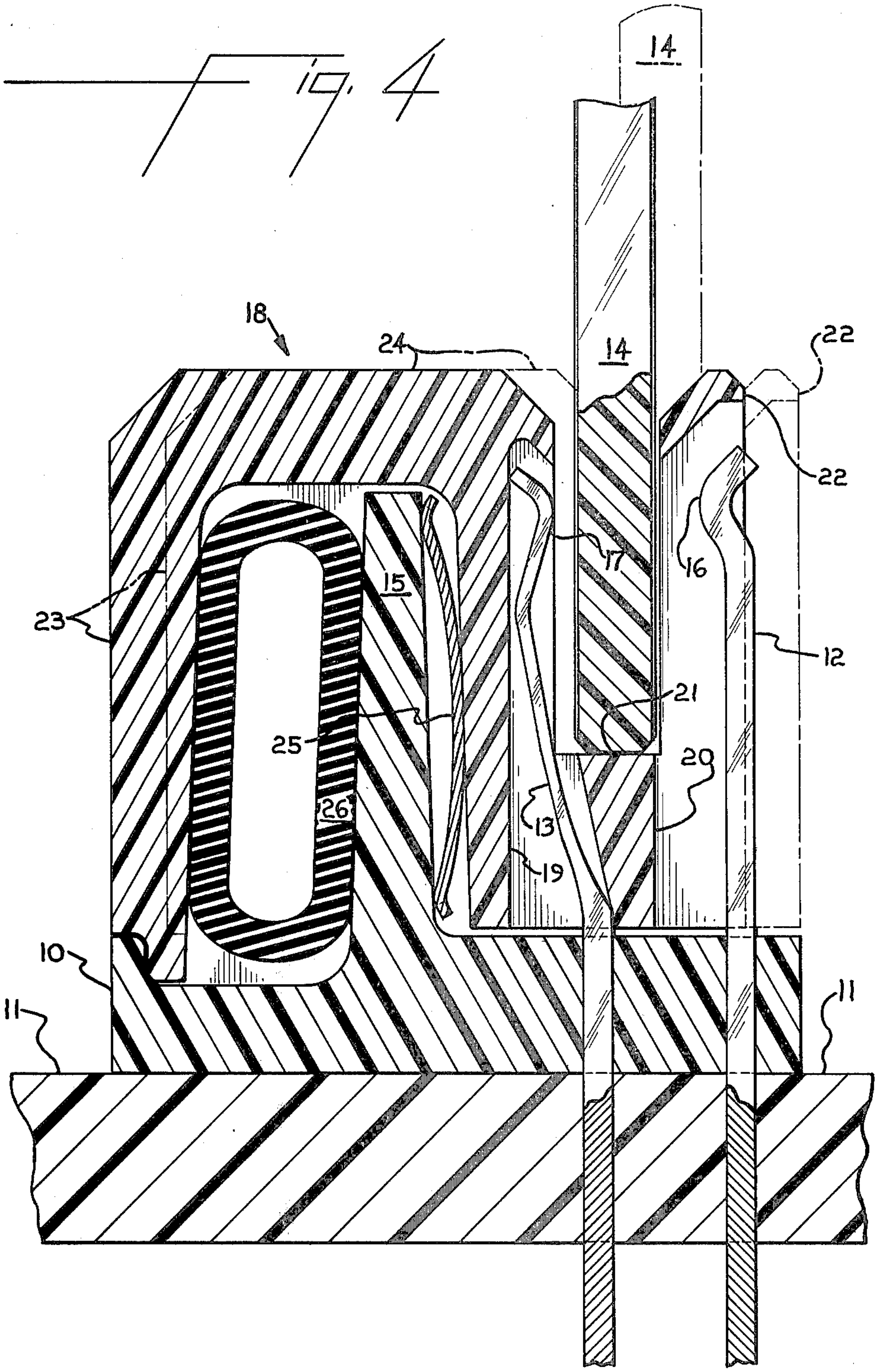
FIG. 4 is a cross-sectional view of the circuit card connector of this invention in which the terminals are in an open position.

Referring now to FIGS. 3 and 4, the connector of this invention employs a movable housing 18 of any suitable rigid dielectric material such as a molded plastic. Movable housing 18 comprises a first panel 19 which is generally vertical extending the length of the connector parallel to rib 15. First panel 19 contains a series of parallel recesses or slots, each aligned with an inside terminal 13. As shown, terminals 13 are recessed into first panel 19 to insulate them from adjacent terminals and to protect them during insertion and removal of a circuit card.

Housing 18 further comprises a support leg 20 integrally joined to first panel 19 and having a generally horizontal receiving surface 21 for supporting the edge of a circuit card 14. Support leg 20 terminates with a plurality of upwardly projecting parallel leaves 22 integrally joined thereto which form a plurality of generally vertical slots corresponding to the number of outside terminals 12. Leaves 22 are arranged to insulate each terminal 12 from adjacent terminals and to protect them during insertion and removal of a circuit card.

Housing 18 also includes a second panel 23. Second panel 23 extends the length of the connector generally parallel to rib 15 on the side of the connector opposite of where the terminals are fixedly supported. Panel 23, which is integrally joined to first panel 19 by a web 24, forms a longitudinal passage with rib 15.

A spring 25 is located between rib 15 and first panel 19 to bias inside terminal 13 toward outside terminal 12 to embrace the edge of a circuit card 14 between contact surfaces 16 and 17. Spring 25 is a bowed leaf spring which may comprise a plurality of resilient members individually spaced along the length of the connector between rib 15 and first panel 19, or it may be formed from one continuous strip of resilient material such as berrylium copper so that it exerts a continuous force uniformly against first panel 19 thereby biasing terminal 13 toward terminal 12.

An expandable tube 26 is located in the longitudinal passage created between second panel 23 and rib 15. Tube 26, which may be formed of any suitable material such as polyurethane, is arranged to be expanded selectively and force second panel 23 outwardly from rib 15 thereby moving housing 18 transversely with respect to the longitudinal axis of the connector against the bias of spring 25 thereby relieving the tension on inside terminal 13. Any suitable hydraulic or pneumatic medium, such as a compressed inert gas, may be used to expand tube 26. As tube 26 is expanded and housing 18 is moved transversely from a closed to an open position, it may be seen in FIG. 4 that leaves 22 will project beyond contact surface 16 which assists in the removal of a circuit card with zero insertion force. A circuit card, moreover, may be inserted along the axis of the connector or perpendicularly thereto.

Figure 2:
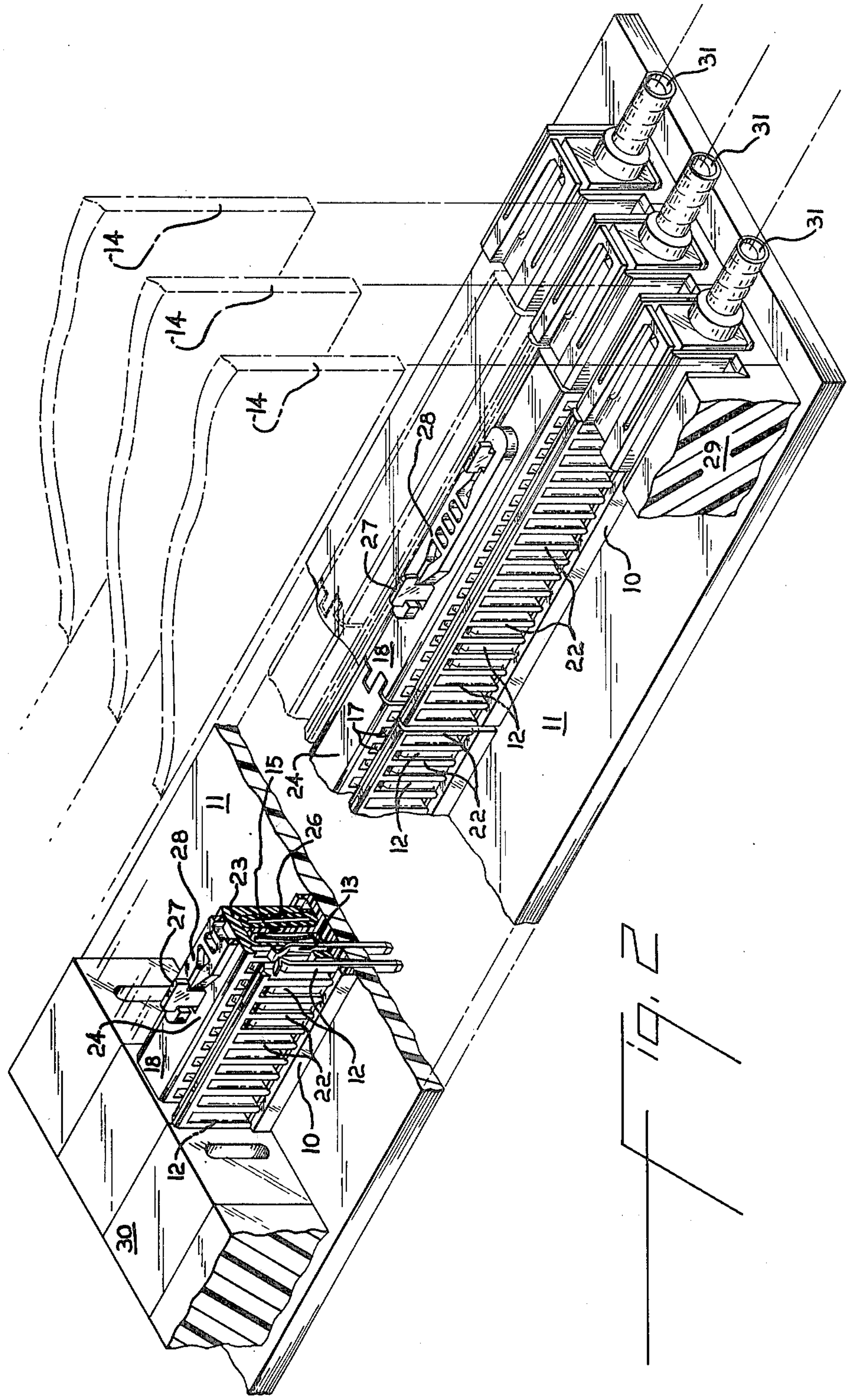
FIG. 2 is a perspective view of an array of circuit card connectors according to this invention.

Referring to FIGS. 1 and 2, it will be seen that the rib 15 can include one or more upwardly projecting fins 27 which extend through holes in web 24. A pair of fins 27 can be joined by an appropriate plastic or metal clip 28 to lock housing 18 in position and control its movement in opening and closing the connector.

The circuit card connector can include a card guide 29 located at the entrance thereof. Card guide 29 is formed with a slot which is aligned with the opening created when opposing terminals 12 and 13 are in an open position to guide the edge of a circuit card into correct position therebetween. The connector also includes a rear stop 30 located at the rear of the connector and which is arranged to prevent a circuit card from being inserted beyond its proper position. The card guide and rear stop may be formed of any suitable molded or extruded conducting or nonconducting material such as plastic. Card guide 29 can be provided with a valve 31 which communicates with expandable tube 26 and can provide for convenient coupling of any expansion media such as a compressed gas supply for inflating and expanding the tube. Valve 31, which may be of any suitable type such as found in a tire tube, for example, also facilitates removal of the expansion media to deflate tube 26 and close the connector.

The circuit card connector of this invention requires zero insertion force when inserting a circuit card. Thus, the improved connector of this invention is particularly suited for bookshelf packaging of circuit cards in computer applications. Furthermore, individual connector units may be joined lengthwise and provided with a continuous expandable tube to accommodate practically any length circuit card now available.

As many widely different embodiments of this invention may be made without departing from the spirit and scope thereof, it is to be understood that this invention is not limited to the specific embodiment thereof except as defined in the appended claims, and all changes which come within the meaning and range of equivalence are intended to be embraced therein.

I claim:

1. In a circuit card connector of the type having a rigid base with an upstanding longitudinal rib and at least one inside terminal and at least one outside terminal fixedly supported by said base in opposed spaced relation, the improvement which comprises a movable housing comprising a first panel parallel to said rib and located between said rib and said inside terminal, a second panel integrally joined to said first panel, said second panel being parallel to said rib and forming a longitudinal passage therebetween, said inside terminal being a shaped and relieved leaf spring flexibly disposed at a slight angle from said outside terminal, a spring located between said first panel and said rib to bias said inside terminal toward said ouside terminal, and an expandable tube located in said longitudinal passage to move said housing against the bias of said spring thereby relieving the tension on said inside terminal.

2. The improved circuit connector of claim 1 wherein said movable housing further comprises a support leg integrally joined to said first panel, said support leg having a generally horizontal receiving surface extending between said inside and outside terminals for receiving and supporting the edge of a circuit card.

3. The improved circuit card connector of claim 2 wherein said movable housing further comprises a plurality of leaves integrally joined to said support leg and projecting upwardly therefrom in parallel spaced relation to said outside terminal.

4. The improved circuit card connector of claims 1, 2 or 3 in which said spring is a bowed leaf spring.

5. A circuit card connector which comprises a base having an upstanding longitudinal rib, at least one outside terminal fixedly supported by said base, at least one inside terminal fixedly supported by said base between said outside terminal and said rib in opposed spaced relation to said outside terminal, said inside terminal being a shaped and relieved leaf spring flexibly disposed at a slight angle from said outside terminal, a movable housing comprising a first panel parallel to said rib and located between said rib and said inside terminal, a second panel integrally joined to said first panel and parallel to said rib forming a longitudinal passage therebetween, a spring located between said first panel and said rib to bias said inside terminal toward said outside terminal, an expandable tube located in said longitudinal passage to move said housing against the bias of said spring thereby relieving the tension on said inside terminal.

6. The circuit card connector of claim 5 wherein said movable housing further comprises a support leg integrally joined to said first panel, said support leg having a generally horizontal receiving surface extending between said inside and outside terminals for receiving and supporting the edge of a circuit card.

7. The circuit card connector of claim 6 wherein said movable housing further comprises a plurality of leaves integrally joined to said support leg and projecting upwardly therefrom in parallel spaced relation to said outside terminal.

8. The circuit card connector of claim 5, 6 or 7 in which said spring is a bowed leaf spring.

* * * * *